United States Patent
Stolze

(10) Patent No.: US 8,227,913 B2
(45) Date of Patent: Jul. 24, 2012

(54) POWER SEMICONDUCTOR MODULE COMPRISING ELASTIC HOUSING FOR ACCOMMODATING MOVEMENT OF INDIVIDUAL SUBSTRATE REGIONS ON A HEAT SINK

(75) Inventor: Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 320 days.

(21) Appl. No.: 10/789,485

(22) Filed: Feb. 27, 2004

(65) Prior Publication Data
US 2004/0164388 A1    Aug. 26, 2004

Related U.S. Application Data

(63) Continuation of application No. PCT/EP02/09457, filed on Aug. 23, 2002.

(30) Foreign Application Priority Data

Sep. 1, 2001 (DE) .................. 101 42 971

(51) Int. Cl.
  H01L 23/10  (2006.01)
  H01L 23/31  (2006.01)
  H01L 23/36  (2006.01)

(52) U.S. Cl. . 257/724; 257/730; 257/713; 257/E23.123; 257/E23.193

(58) Field of Classification Search .................. 257/685, 257/702, 703, 706, 707, 717, 718, 719, 701, 257/704, 705, 712, 713, 720, 723, 724, 725, 257/726, 727, 728, E23.08, E23.101, E23.102, 257/E23.103, E23.104, E23.105, E23.106, 257/E23.107, E23.108, E23.109, E23.11, 257/E23.111, E23.112, E23.113, E23.116, 257/E23.117, E23.118, E23.119, E23.12, 257/E23.121, E23.122, E23.123, E23.124, 257/E23.125, E23.126, E23.127, E23.128, 257/E23.129, E23.13, E23.131, E23.132, 257/E23.133, E23.134, E23.193, E23.194
See application file for complete search history.

(56) References Cited

U.S. PATENT DOCUMENTS

| | | | | |
|---|---|---|---|---|
| 4,744,007 A | * | 5/1988 | Watari et al. .................. 361/718 |
| 5,280,193 A | * | 1/1994 | Lin et al. ......................... 257/723 |
| 5,639,989 A | * | 6/1997 | Higgins, III .................. 257/660 |
| 5,698,899 A | * | 12/1997 | Hirakawa et al. ............. 257/712 |
| 5,819,402 A | * | 10/1998 | Edwards et al. ................ 29/840 |

(Continued)

FOREIGN PATENT DOCUMENTS

DE    39 06 690 A1    10/1989

(Continued)

*Primary Examiner* — Lynne Gurley
*Assistant Examiner* — Andrew O. Arena
(74) *Attorney, Agent, or Firm* — Murphy, Bilak & Homiller, PLLC

(57) ABSTRACT

The power semiconductor module (1) comprises several semiconductor components (6, 7, 8), located on a substrate (2). The aim of the invention is to prevent a reduction in the pressure of the substrate against a cooling surface and the resulting loss of cooling arising from deformations. Said aim is achieved, whereby the substrate (2) comprises several substrate regions (3, 4, 5), with one or several connection regions (31, 32), located between substrate regions (3, 4, 5), by means of which the substrate regions (3, 4, 5) are connected such as to move relative to each other.

17 Claims, 1 Drawing Sheet

U.S. PATENT DOCUMENTS

| | | | | |
|---|---|---|---|---|
| 6,157,538 | A * | 12/2000 | Ali et al. | 361/704 |
| 6,208,023 | B1 * | 3/2001 | Nakayama et al. | 257/696 |
| 6,297,549 | B1 * | 10/2001 | Hiyoshi | 257/703 |
| 6,424,026 | B1 * | 7/2002 | Mangtani | 257/675 |
| 6,507,098 | B1 * | 1/2003 | Lo et al. | 257/686 |
| 6,541,872 | B1 * | 4/2003 | Schrock et al. | 257/783 |
| 6,548,894 | B2 * | 4/2003 | Chu et al. | 257/706 |
| 6,602,121 | B1 * | 8/2003 | Halley | 451/287 |
| 6,627,997 | B1 * | 9/2003 | Eguchi et al. | 257/777 |
| 6,665,187 | B1 * | 12/2003 | Alcoe et al. | 361/719 |
| 6,703,707 | B1 * | 3/2004 | Mamitsu et al. | 257/718 |
| 6,979,909 | B2 * | 12/2005 | Shinohara | 257/796 |
| 2005/0146023 | A1 * | 7/2005 | Edwards | 257/707 |

FOREIGN PATENT DOCUMENTS

| | | |
|---|---|---|
| DE | 4411858 A1 | 11/1994 |
| DE | 19609929 A1 | 9/1997 |
| DE | 197 07 514 A1 | 8/1998 |
| DE | 199 42 915 A1 | 3/2001 |
| EP | 0969511 A2 | 6/1999 |
| EP | 1 083 599 * | 3/2001 |
| JP | 60-195330 A | 10/1985 |
| JP | 7-202088 A | 8/1995 |
| JP | 9-134983 A | 5/1997 |
| JP | 2001-118987 * | 4/2001 |
| JP | 2001118987 | 4/2001 |
| WO | 01/08219 A1 | 2/2001 |

* cited by examiner

POWER SEMICONDUCTOR MODULE COMPRISING ELASTIC HOUSING FOR ACCOMMODATING MOVEMENT OF INDIVIDUAL SUBSTRATE REGIONS ON A HEAT SINK

CROSS REFERENCE TO RELATED APPLICATION

This application is a continuation of copending International Application No. PCT/EP02/09457 filed Aug. 23, 2002 which designates the United States, and claims priority to German application No. 101 42 971.1 filed Sep. 1, 2001.

TECHNICAL FIELD OF THE INVENTION

The present invention relates to a power semiconductor module having a plurality of semiconductor components situated on a substrate.

DESCRIPTION OF THE RELATED ART

Modules of this type are disclosed for example in DE 39 06 690 A1, DE 199 42 915 A1, DE 197 07 514 A1 and JP 2001118987.

In the case of a power semiconductor module revealed in DE 199 42 915 A1 for example, a plurality of power semiconductors are arranged closely adjacent in a row on the top side of an insulating and thermally conductive carrier (substrate). Said power semiconductors are electrically connected by means of contact areas via metallic conductor tracks formed on the same top side, and can be driven in this way.

The likewise metallic, for example copper-coated, underside of the substrate is pressed onto a heat sink by means of electrically conductive pressure pieces. The power losses occurring in the form of heat during operation of the power semiconductor module are dissipated by these means. In order to ensure an effective dissipation of heat or a low heat transfer resistance and thus a safe and reliable operation of the power semiconductor module, the heat sink must bear against the underside of the substrate in planar fashion and without any gaps.

What are problematic in this case are the mechanical stresses in the module brought about by different thermal expansion coefficients and low bending stiffness of the various module components (e.g. of substrate and semiconductor material). Internal stresses may also result from the high-temperature production process of a power semiconductor module and be additionally intensified by subsequent soldering steps.

Mechanical stresses and/or the low bending stiffness may in this case lead to undesirable deformations or flexures at the underside of the substrate or module. A uniformly planar contact area is then no longer ensured since the heat transfer between cooling element and cooling is impaired by the air gaps and interspaces which arise on account of the deformations. The aforementioned effects cannot be compensated for particularly where the substrate is not pressed directly, or is pressed only inadequately, onto the heat sink, such as, for example, in the case of edge fixing in the module center, since the flexure (curvature) is greatest there. The effect is manifested to a greater extent, moreover, the larger the module. The size of the module in turn increases with the power.

In order to solve this problem area, it is conceivable to provide an additional metal part—e.g. a copper plate—as baseplate to which the underside of the substrate is fixedly connected, e.g. soldered. Existing form deviations would then be compensated for by the intervening layer of solder. The baseplate would then be connected to the heat sink by its underside and serves both for a uniform distribution of heat (as so-called heat spreader) and for taking up mechanical stresses.

However, by virtue of the additional baseplate and the mounting thereof, this construction increases the overall costs of a power semiconductor module configured in this way.

SUMMARY OF THE INVENTION

Therefore, the present invention is based on the object of providing a power semiconductor module which can be produced cost-effectively with a satisfactory thermal contact with a cooling element, and which manages without an additional baseplate.

In the case of a power semiconductor module of the type mentioned in the introduction, this object is achieved according to the invention by virtue of the fact that the substrate has a plurality of substrate regions, and that one or a plurality of connecting regions are situated between substrate regions, via which connecting regions the substrate regions are connected such that they can move relative to one another.

One essential aspect of the present invention is that the arrangement of the semiconductor components and, if appropriate, of further components is not effected on a single, integral substrate, but rather is distributed between a plurality of substrate regions (partial substrates). As a result, each individual partial substrate can be better pressed against the cooling area and thus be better cooled.

Furthermore, although each individual partial substrate like-wise experiences a deformation on account of the previously described temperature-dictated stresses and thermal effects, said deformation is significantly smaller than the deformation of a single overall substrate of corresponding area would be. In other words: the in some cases unavoidable deformation is divided between a plurality of partial substrates and thus correspondingly between smaller partial deformations whose absolute deformation maxima is significantly smaller.

Substrates become more sensitive to fracture and damage as their size increases. Therefore, one advantage of the invention consists, moreover, in the fact that the power semiconductor module according to the invention with its plurality of individual substrate regions is significantly more robust mechanically. This advantageously increases the yield in the manufacturing and mounting process.

A further advantage of the present invention consists in the fact that the individual substrate regions populated with semiconductor components can be individually tested in advance and be replaced in the event of a defect. The rejects in respect of finished modules can thus be minimized in a cost-effective manner.

This is accompanied by a further increase in the yield, because in the event of defective substrate regions, the entire substrate material associated with a power semiconductor module, if appropriate with the components already mounted, need not necessarily be rejected.

A further essential aspect of the invention is to be seen in the fact that the substrate regions are connected such that they can move relative to one another via one or a plurality of connecting regions. The respective connecting region has a higher mechanical deformability (elasticity) than the substrate usually has. Thus, as it were hinges or articulated regions are formed between the substrate regions. The connecting regions prevent the substrate regions from having a reciprocal mechanical influence in the adjoining substrate regions.

Furthermore, at each connecting region there is the possibility of performing a correction in the orientation of the individual substrate regions in such a way that the deformation is minimized and, consequently, a planar contact area of the power semiconductor module is formed, which provides an optimized heat transfer to a heat sink to be connected.

According to the invention, the power semiconductor module additionally has a housing, which, in the region between the substrate regions, has action points for a mechanical pressure application of the connecting regions, the housing applying pressure to the individual substrate regions.

The action points for a mechanical pressure application of the connecting regions, in particular, ensures a particularly good heat conduction to a cooling element to be connected to the mounting area (underside) of the power semiconductor module.

In this case, the action points may be e.g. depressions in the housing which enable external mechanical pressure means (e.g. tensioning bolts) to reach through toward the substrate plane. However, it is also possible to provide, within the housing, pressure webs which forward pressure forces acting externally on the housing to the action points.

Furthermore, according to the invention, the housing is embodied in resilient fashion in particular in the portions between the action points for a mechanical pressure application. This ensures a contact pressure in each case individually on each partial substrate, the individual partial substrates being mechanically separated by the action points (e.g. by screws, clips, rivets, etc.). The action points themselves do not directly exert pressure on the partial substrate.

An advantageous development of the semiconductor module according to the invention provides for the connecting regions to be formed by recesses in the material of the substrate. This represents, in terms of manufacturing technology, a particularly simple possibility for providing connecting regions with increased mobility or deformability. The recesses may be formed for example as a perforation.

In terms of manufacturing technology, it is particularly preferred for the material recesses to be slotted.

Preferably, the substrate may be composed of ceramic. This permits an outstanding electrical insulation of the semiconductor components and electrical connections mounted on said substrate together with good heat dissipation via the ceramic to the heat sink. In this case, a thermally conductive paste may be introduced between substrate and heat sink.

Furthermore, it is advantageous if the housing, at least in the regions of the substrate regions, is such that it acts on the substrate regions with a spring force. As a result, a pressure is exerted individually on each partial substrate.

BRIEF DESCRIPTION OF THE DRAWINGS

Exemplary embodiments of the invention are explained in more detail below with reference to a drawing; in the figures, diagrammatically.

DETAILED DESCRIPTION OF THE PREFERRED EMBODIMENTS

Figure 1:
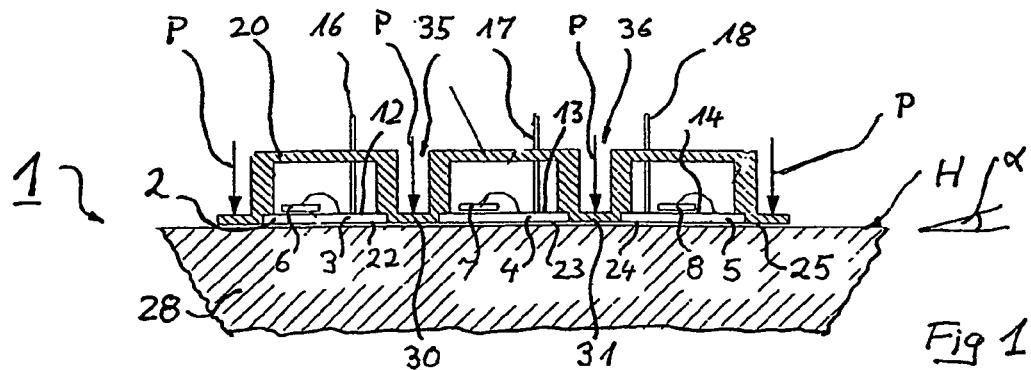
FIG. 1 shows a first exemplary embodiment of a power semi-conductor module according to the invention in cross section.
Figure 2:
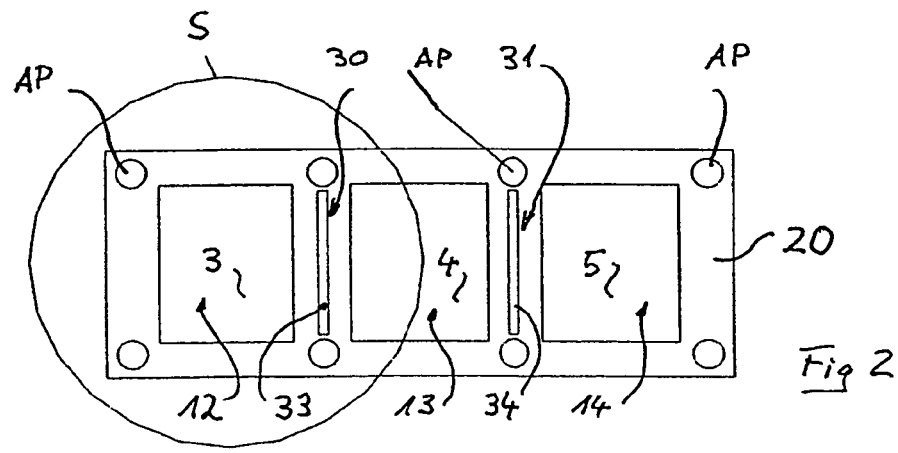
FIG. 2 shows the substrate of the power semiconductor module from FIG. 1 in plan view.

The power semiconductor module 1 shown in FIG. 1 comprises a ceramic substrate (carrier element) 2, which is segmented into a plurality of substrate regions (partial substrates) 3, 4 and 5 and has as it were three segments S (FIG. 2). Arranged on the substrate regions 3, 4 and 5 are semiconductor components 6, 7 and 8, which are all constituent parts of the overall module 1. The semiconductor components are contact-connected via indicated bonding wires to conductor tracks (not specifically illustrated) which are formed on the respective surface 12, 13, 14 of the partial substrates. The conductor tracks of different partial substrates may be electrically connected to one another via bonding wires. The conductor tracks lead to contact pins (connection pins, 16, 17, 18 for the external connection of the power semiconductor module. The semiconductor components 6, 7 and 8 may be power semiconductors which develop high power losses converted into heat and therefore require an effective dissipation of heat.

The semiconductor module furthermore comprises a resilient, i.e. a correspondingly elastic, module housing 20 produced in the plastics injection-molding method. The rear sides 22, 23, 24 of the partial substrates 3, 4, 5 form partial areas of the module underside 25, which is made as planar as possible for thermal contact with a heat sink 28 and to which with a thermally conductive paste, for example, is applied. The use of a plurality of partial substrates serves for realizing the planar embodiment. If just a single substrate were used, on which all the semiconductor components would have to be arranged and which accordingly would have to have the total mounting area of all the partial substrates, on the one hand internal mechanical stresses resulting from instances of thermal loading already manifested in the production process would have considerable influence and, on the other hand satisfactory thermal contact would not be obtained and the cooling of the substrate would therefore not be ensured.

In the case of the semiconductor module according to the invention, said stresses lead only to small deformations, because they are distributed between a plurality of partial substrates and in each case only have comparatively little influence owing to the smaller absolute extent of the individual partial substrate.

Besides the substrate regions 3, 4, and 5 the substrate 2 has connecting regions 30 and 31 formed between the substrate regions (also cf. FIG. 2). The substrate regions 3 and 4 are connected such that they can move relative to one another e.g. via the connecting region 30. The connecting region 30 functions as it were as an articulated joint or hinge, so that the substrate regions 3 and 4 can also be oriented with respect to one another to form an angle other than 180° (correction angle). By way of example, this prevents a deformation of the substrate region 3 from continuing into the substrate region 4. By way of example, if the substrate region 3 is tilted through an angle α (illustrated in greatly enlarged and exaggerated fashion in FIG. 1) with respect to the horizontal H due to deformations on account of thermally induced stresses, it is possible, by correspondingly tilting the substrate region 4 in the opposite sense, to avoid a propagation of said angle α into the substrate region 4 and even to compensate for the tilting by means of an equal and opposite tilting. A module underside 25 which is free to the greatest possible extent from deformations manifested on account of thermally induced stresses is thus provided as contact area of the power semiconductor module.

According to FIG. 2, by way of example, the connecting regions 30 and 31 are formed by slots 33, 34 introduced into the material of the initial substrate. However, other geometrical forms and configurations of the connecting regions are also conceivable, which in the same way effect an increased flexibility of the connecting regions with respect to the initial substrate.

The housing 20 has access regions 35, 36, through which, e.g. by means of external clips or screw connections, mechanical pressure (symbolized by arrows p) can be exerted directly on the connecting regions 30, 31 in order to press the substrate altogether homogeneously onto the heat sink 28. Further mechanical contact pressure may be applied, as indicated by further arrows P, at contact-pressure points AP in the edge regions of the power semiconductor module.

Figure 3:
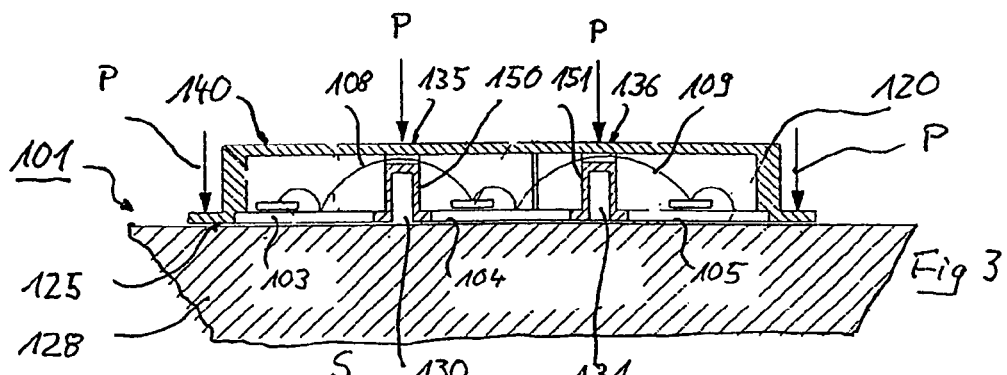
FIG. 3 shows a second exemplary embodiment of a power semiconductor module according to the invention in cross section.

FIG. 3 diagrammatically shows a variant of a power semiconductor module 101 according to the invention in cross section. Accordingly, a plurality of populated substrate regions (partial substrates) 103, 104, 105, which have already been described extensively in FIG. 1, form segments S of a substrate 102 (see FIG. 4). The conductor tracks of different partial substrates may be electrically connected to one another via bonding wires 108, 109. Here, too, the undersides of the substrate regions form partial areas of the module underside 125, which is made planar for thermal contact with a heat sink 128.

Figure 4:
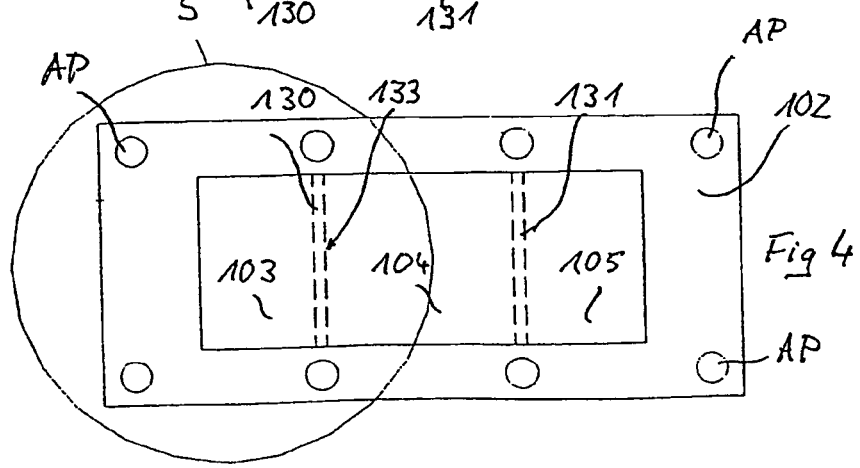
FIG. 4 shows the substrate of the power semiconductor module from FIG. 2 in plan view.

According to FIG. 4, connecting regions 130 and 131 are formed by slots 133, 134 introduced into the material of the initial substrate. A resilient housing 120 has access regions 135, 136 on its top side 140. Mechanical pressure (indicated by arrows P) applied to said access regions 135, 136 e.g. through external clips or screw connections is transmitted to the connecting regions 130, 131 by housing-internal plungers or vertical bridges 150, 151. As a result, the substrate 101 is pressed onto the heat sink 128 altogether in a highly homogeneous manner. Further mechanical contact pressure may be applied, as indicated by further arrows P, at contact-pressure points AP in the edge regions of the power semiconductor module.

A particularly advantageous effect is thus achieved by virtue of the fact that a contact pressure is exerted by the housing in each case individually on each partial substrate, the action points and the individual partial substrates being mechanically separated from one another. The action points themselves thus do not exert a direct pressure on the partial substrates.

The invention claimed is:

1. A power semiconductor module comprising a plurality of semiconductor components situated on substrate regions, wherein
    each substrate region has a top surface and side faces, wherein side faces of two adjacent substrate regions face each other;
    between each two adjacent substrate regions an elastic connecting element is arranged such that the connecting element directly contacts the side faces of the two adjacent substrates, wherein said connecting elements are designed to prevent a deformation of one substrate region to continue to an adjacent substrate region; and
    wherein the connecting elements are formed by recesses in a plastic housing enclosing said substrate regions, each recess extending from an exterior of the housing and being arranged between adjacent substrate regions.

2. The power semiconductor module as claimed in claim 1, wherein
    the material recesses are slotted.

3. The power semiconductor module as claimed in claim 2, wherein
    the module housing, at least in the regions of the substrate regions, is such that it acts on the substrate regions with a spring force.

4. The power semiconductor module as claimed in claim 1, wherein
    the substrate is a ceramic.

5. The power semiconductor module as claimed in claim 1, wherein
    the substrate regions are ceramic.

6. The power semiconductor module as claimed in claim 5, wherein
    the housing, at least in the regions of the substrate regions, is such that it acts on the substrate regions with a spring force.

7. The power semiconductor module as claimed in claim 1, wherein
    the module housing, at least in the regions of the substrate regions, is such that it acts on the substrate regions with a spring force.

8. The power semiconductor module as claimed in claim 1, wherein
    in an area between the substrate regions, the housing has action points for a mechanical pressure application of the connecting elements, and
    the housing applies pressure to the individual substrate regions.

9. The power semiconductor module as claimed in claim 1, further comprising
    a heat sink having a flat surface, wherein the bottom surface of the plurality of substrate elements and said plurality of connecting elements are arranged on said flat surface.

10. A power semiconductor module comprising
    a plurality of substrate elements having top and bottom surface and side walls, each substrate element comprising a semiconductor component arranged on the top surface of a substrate element;
    one or a plurality of elastic connecting elements, each elastic connecting element directly contacting opposing side walls of two adjacent substrate elements, wherein said connecting elements are designed to prevent a deformation of one substrate element to continue to an adjacent substrate element;
    a plastic module housing enclosing said plurality of substrate elements; and
    wherein the connecting elements are formed by recesses in the module housing extending from an exterior of the housing and are arranged between adjacent substrate elements.

11. The power semiconductor module as claimed in claim 10, wherein
    the material recesses are slotted.

12. The power semiconductor module as claimed in claim 10, wherein
    the substrate is a ceramic.

13. The power semiconductor module as claimed in claim 10, wherein
    the module housing, at least in the regions of the substrate elements, is such that it acts on the substrate elements with a spring force.

14. The power semiconductor module as claimed in claim 10, further comprising a heat sink having a flat surface, wherein a bottom surface of the plurality of substrate elements and said plurality of connecting elements are arranged on said flat surface.

15. The power semiconductor module as claimed in claim 10, wherein
the module housing in a region between the substrate elements comprises action points for a mechanical pressure application of the connecting elements, and
the housing applies pressure to the individual substrate elements.

16. A power semiconductor module comprising:
a heat sink having a flat surface;
a plurality of substrates arranged on the flat surface of the heat sink;
a plurality of semiconductor components arranged on the substrates; and
one or a plurality of elastic connecting regions,
each elastic connecting region being in direct contact with opposing side walls of adjacent ones of the substrates and arranged on the flat surface of the heat sink between adjacent ones of the substrates,
wherein the connecting regions are designed to prevent a deformation of one substrate to continue to an adjacent substrate and the connecting regions are formed by recesses in a plastic module housing enclosing said substrates, each recess extending from an exterior of the housing and being arranged between adjacent substrates.

17. A power semiconductor module, comprising:
a substrate segmented into a plurality of spaced apart substrate regions;
at least one semiconductor component arranged on one or more of the substrate regions;
a plastic module housing enclosing said substrate regions and said at least one semiconductor component;
connecting regions formed by recesses in the module housing,
each recess extending from an exterior of the housing and being arranged between adjacent substrate regions,
each connecting region being in direct contact with side faces of adjacent ones of the substrate regions; and
wherein the connecting region has a higher mechanical deformability than the substrate regions and thus functions as an articulated hinge with each of the adjacent substrate regions so that the adjacent substrate regions can move relative to one another about the articulated hinges.

* * * * *